United States Patent
Ye

(10) Patent No.: US 8,669,552 B2
(45) Date of Patent: Mar. 11, 2014

(54) OFFSET ELECTRODE TFT STRUCTURE

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 13/289,033

(22) Filed: Nov. 4, 2011

(65) Prior Publication Data
US 2012/0223303 A1 Sep. 6, 2012

Related U.S. Application Data

(60) Provisional application No. 61/448,429, filed on Mar. 2, 2011.

(51) Int. Cl.
- *H01L 29/10* (2006.01)
- *H01L 29/08* (2006.01)
- *H01L 31/062* (2012.01)
- *H01L 27/146* (2006.01)
- *H01L 51/00* (2006.01)

(52) U.S. Cl.
USPC ............... 257/43; 257/40; 257/290; 257/443

(58) Field of Classification Search
USPC ......... 257/43, 40, 52, 63, 60, 135, 91, 92, 94, 257/290, 291, 292, 293, 443, 59, 72
See application file for complete search history.

(56) References Cited

U.S. PATENT DOCUMENTS

| 5,668,391 A | 9/1997 | Kim et al. |
| 6,107,660 A | 8/2000 | Yang et al. |
| 6,320,221 B1 | 11/2001 | Choi et al. |
| 6,995,053 B2 | 2/2006 | Schuele et al. |
| 7,002,176 B2 | 2/2006 | Iechi et al. |
| 7,586,130 B2 | 9/2009 | Kawashima et al. |
| 7,588,971 B2 | 9/2009 | Wang et al. |
| 7,638,374 B2 | 12/2009 | Wang et al. |
| 7,927,713 B2 | 4/2011 | Ye |
| 2007/0278478 A1 | 12/2007 | Zaumseil et al. |
| 2007/0290227 A1* | 12/2007 | Liang et al. ............ 257/151 |
| 2008/0122351 A1 | 5/2008 | Kitazume |
| 2010/0032668 A1 | 2/2010 | Yamazaki et al. |
| 2013/0099234 A1* | 4/2013 | Yamazaki ............ 257/43 |

FOREIGN PATENT DOCUMENTS

EP 2159845 A1 3/2010

OTHER PUBLICATIONS

Ma et al., "Solid-state supercapacitors for electronic device applications", Applied Physics Letters, 87, 123503-1-123503-3 (2005).

(Continued)

*Primary Examiner* — Chuong A. Luu
(74) *Attorney, Agent, or Firm* — Patterson & Sheridan, LLP

(57) ABSTRACT

The present invention generally relates to an offset electrode TFT and a method of its manufacture. The offset electrode TFT is a TFT in which one electrode, either the source or the drain, surrounds the other electrode. The gate electrode continues to be below both the source and the drain electrodes. By redesigning the TFT, less voltage is necessary to transfer the voltage from the source to the drain electrode as compared to traditional bottom gate TFTs or top gate TFTs. The offset electrode TFT structure is applicable not only to silicon based TFTs, but also to transparent TFTs that include metal oxides such as zinc oxide or IGZO and metal oxynitrides such as ZnON.

4 Claims, 4 Drawing Sheets

(56) References Cited

OTHER PUBLICATIONS

Chong et al., "Design of Noncoplanar Diagonal Electrode Structure for Oxide Thin-Film Transistor", IEEE Electron Device Letters, vol. 32, No. 1, Jan. 2011, p. 39-41.

Liu et al., "Nitrogenated amorphous InGaZnO thin film transistor", Applied Physics Letters, 98, 052102-1-052102-3 (2011).

International search report and written opinion for PCT/US12/027142 dated Sep. 21, 2012.

* cited by examiner

OFFSET ELECTRODE TFT STRUCTURE

CROSS-REFERENCE TO RELATED APPLICATIONS

This application claims benefit of U.S. Provisional Patent Application Ser. No. 61/448,429, filed Mar. 2, 2011, which is herein incorporated by reference.

GOVERNMENT RIGHTS IN THIS INVENTION

This Invention was made with Government support under Agreement No. DAAD19-02-3-0001 awarded by ARL. The Government has certain rights in this Invention.

BACKGROUND OF THE INVENTION

1. Field of the Invention

Embodiments of the present invention generally relate to a thin film transistor (TFT) and a method of its manufacture.

2. Description of the Related Art

Current interest in TFT arrays is particularly high because these devices may be used in liquid crystal active matrix displays (LCDs) of the kind often employee for computer and television flat panels. The LCDs may also contain light emitting diodes (LEDs), such as organic light emitting diodes (OLEDs) for back lighting. The LEDs and OLEDs require TFTs for addressing the activity of the displays.

Bottom gate TFTs made with amorphous silicon have been utilized for the flat panel display industry for many years. Unfortunately, the on and off-current driven through source and drain electrodes of the TFT is limited by its channel material as well as the channel width and length. Additionally, the turn-on gate voltage, or a threshold voltage, under a voltage between the source and drain electrodes, is determined by the accumulation of the carrier in the active channel area of the semiconductor active layer which could change as the change of the charge in the channel material, dielectric material as well as interfaces between the materials after bias temperature stress or current temperature stress.

Therefore, there is a need in the art for a TFT that utilizes an additional source-drain current controlling layer beneath the source or drain electrode or both to miminize the off-current when the gate voltage sets at a turn-off voltage. Because the additional control of the source-drain current control, the channel length between the source-drain can be significantly reduced for high on-current when the TFT turns on, keeping the off-current low when the TFT turns off. In addition, the TFT design keeps the turn-on voltage, or threshold gate voltage, unchanged after operations under different conditions.

SUMMARY OF THE INVENTION

The present invention generally relates to an offset electrode TFT and a method of its manufacture. The offset electrode TFT is a TFT in which one electrode, either the source or the drain, surrounds the other electrode. The gate electrode continues to be below both the source and the drain electrodes. By redesigning the TFT, less voltage is necessary to transfer the voltage from the source to the drain electrode as compared to traditional bottom gate TFTs or top gate TFTs. The offset electrode TFT structure is applicable not only to silicon based TFTs, but also to transparent TFTs that include metal oxides such as zinc oxide or IGZO and metal oxynitrides such as ZnON.

In one embodiment, a TFT is disclosed. The TFT comprises a gate electrode disposed above a substrate; a gate dielectric layer disposed over the gate electrode; a channel semiconductor layer disposed over the gate dielectric layer; a first electrode disposed over the channel semiconductor layer and at least partially defining a via; and a second electrode disposed over the channel semiconductor layer, within the via and extending over at least a portion of the first electrode.

In another embodiment, a TFT includes a gate electrode, a source electrode disposed over the gate electrode and a drain electrode disposed over the source electrode with dielectric or semiconductor layer in between.

In another embodiment, a TFT fabrication method is disclosed. The method includes depositing a gate dielectric layer over a gate electrode, depositing a channel semiconductor layer over the gate dielectric layer, depositing a source electrode over the channel semiconductor layer and depositing a first source dielectric layer over the source electrode. The method also includes depositing a second source dielectric layer over the first source dielectric layer and removing at least a portion of the source electrode, the first source dielectric layer and the second source dielectric layer to form a via that is bound by edges of the source electrode, the first source dielectric layer and the second source dielectric layer and expose at least a portion of the control semiconductor layer. The method also includes depositing a spacer layer over at least a portion of the control semiconductor layer and the edges of the source electrode, the first source dielectric layer and the second source dielectric layer. The method additionally includes depositing a first control semiconductor layer over the exposed channel semiconductor layer, depositing a second control semiconductor layer over the first control semiconductor layer and depositing a drain electrode over the second control semiconductor layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A, 1C, 1E, 1G, 1I, 1K, 1M, 1O, 1Q, 1S and 1U are cross-sectional views while FIGS. 1B, 1D, 1F, 1H, 1J, 1L, 1N, 1P, 1R, 1T and 1V are top views.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
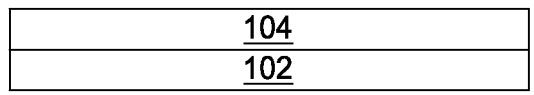
FIGS. 1A-1V are schematic cross-sectional and top views of an offset TFT 100 at various stages of production.

The present invention generally relates to an offset electrode TFT and a method of its manufacture. The offset electrode TFT is a TFT in which one electrode, either the source or the drain, surrounds the other electrode. The gate electrode continues to be below both the source and the drain electrodes. By redesigning the TFT, less off-current from the source to the drain electrode is achieved when the gate voltage sets at an off voltage as compared to traditional bottom gate TFTs or top gate TFTs. It will also make the threshold voltage of the gate electrode, at which TFT starts to turns on or off, less sensitive of the change of active layer, dielectric layer and their interfaces. The offset electrode TFT structure is applicable not only to silicon based TFTs, but also to transparent TFTs that include metal oxides such as zinc oxide or IGZO and metal oxynitrides such as ZnON.

Current TFTs have a gate electrode, a gate dielectric layer, a semiconductor channel, a source electrode and a drain electrode. A vertical TFT structure was presented in a paper that published in 2005. The vertical TFT has a supercapacitor, a thin rough electrode, a semiconductor, and a drain electrode. In the vertical TFT, the supercapacitor is made of LiF. In the invention discussed herein, the supercapacitor comprises metal oxides or metal oxynitride or a combination with thin film semiconductors such as a-Si or possible with a dielectric layer, but not LiF specifically, or other electrolytic materials. Therefore, the capacitor will be made using CVD or PVD processes commonly utilized in semiconductor fabrication and equipment. In addition, the electrodes will be made with oxide or oxynitride based composite materials, instead of thin rough electrodes. The invention includes the materials to make the TFT, the materials for the capacitor, the materials for the electrodes and the material configuration; the film stack and process; and a solution for high off current. The invention is a new way to make a TFT and could provide unique features to address the stability issues with are encountered in current TFT structures.

In the state of the art TFT, when gate voltage is set at an off voltage, certain level current still drives through TFT source and drain electrodes under a source-drain voltage, depending on its channel material as well as the channel width and length. Because of possible high off-current, the short channel device is not practical although it can provide high on-current at a low voltage. In addition, its turn-on gate voltage, or threshold voltage, under a voltage between the source and drain electrodes is determined by the accumulation of the carrier in the channel layer, which could change with the change of the electrical charge in the channel material, dielectric materials, and their interfaces composed of the TFT after bias temperature stress or current temperature stress. The TFT proposed herein has a gate, a gate dielectric, a channel semiconductor layer, and one metal electrode in direct contact with the semiconductor layer serves as source, which is similar as the state-of-the-art TFT. However, the TFT also has a spacer and a control semiconductor on the top of the channel semiconductor but beneath the drain electrodes. The new TFTs proposed herein will provide a higher current than the state-of-the-art TFTs since the actual channel length will be much shorter when the device is turned on. Since the source-drain current is controlled by the control semiconductor layer(s), off-current of the short-channel device can be minimized. In addition, the charge trapping at the interfaces in the channel region and bulk (the channel layer under the spacer) becomes less critical for the turn on voltage for the device, since the turn-on voltage the device will be also determined by the accumulation in the control region which has channel semiconductor, control semiconductor and drain electrode. Therefore, threshold gate voltage shift caused by a change of charge in interface and bulk layers should be significantly minimized. The invention includes: a TFT configuration comprising the TFT composed of a gate, gate dielectric, channel semiconductor, source electrode, control semiconductor or semiconductors, drain electrode; a TFT configuration comprising the TFT has a channeling region and one or more controlling regions. The channel semiconductor and the control semiconductor material can be different or the same. Additionally, an additional barrier layer may be present in between the semiconductor layers. For example, metal oxide or metal oxynitride is used as channel semiconductor, and amorphous Si is used as control semiconductor. Alternatively, the metal oxynitride may be used as both the channel semiconductor and control semiconductor; however the carrier concentration or the band gap will be different or a thin SiO or SiN layer will be present in between the semiconductor layers. The spacer is made of SiO or SiN, or other dielectric materials. The spacer is made from a conformal deposition and etch back process. The controlling region for on-off can result from a barrier between the channel semiconductor and control semiconductor, or a barrier created inside the control semiconductor material, or a barrier between the source metal and the channel semiconductor or between the drain metal and the control semiconductor. The barrier can result from the Fermi level difference, work function difference, band gap difference, or others film property difference.

Figure 1B:
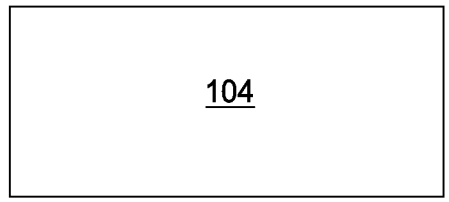
Figure 1C:
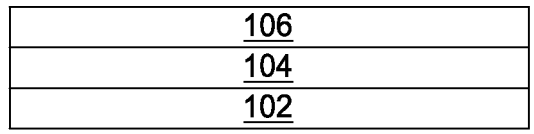
Figure 1D:
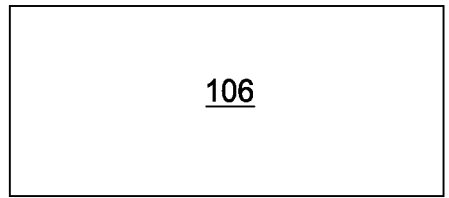
Figure 1E:
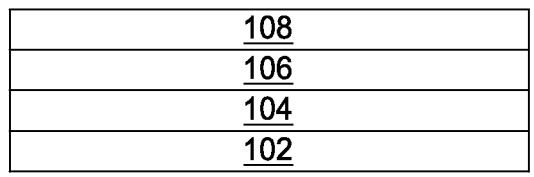
Figure 1F:
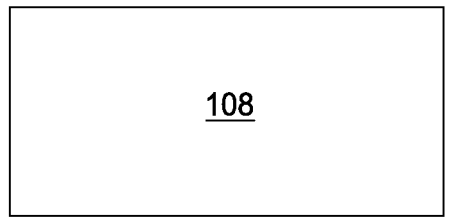
Figure 1G:
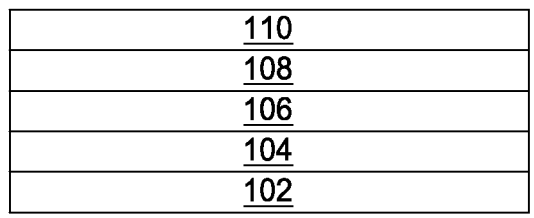
Figure 1H:
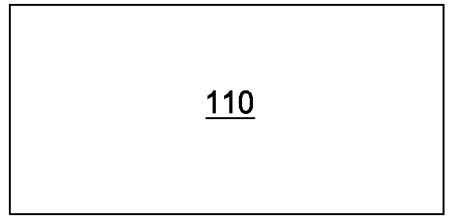
Figure 1:
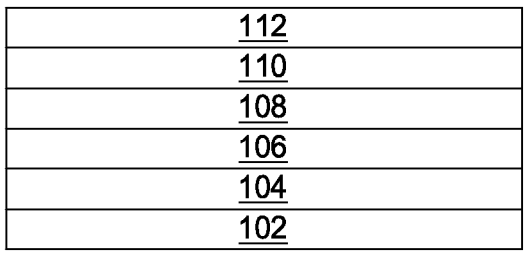
Figure 1J:
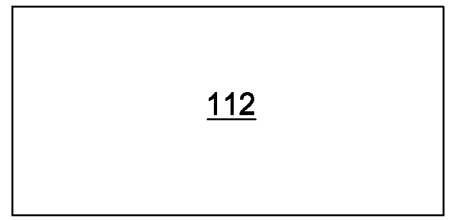
Figure 1K:
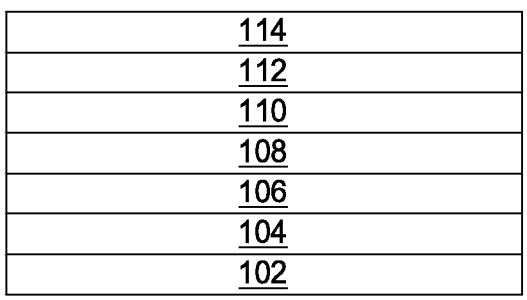
Figure 1L:
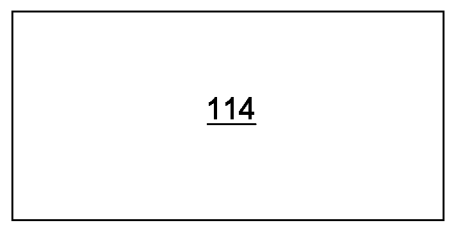
Figure 1M:
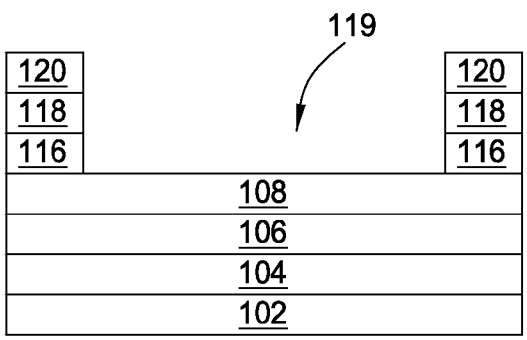
Figure 1N:
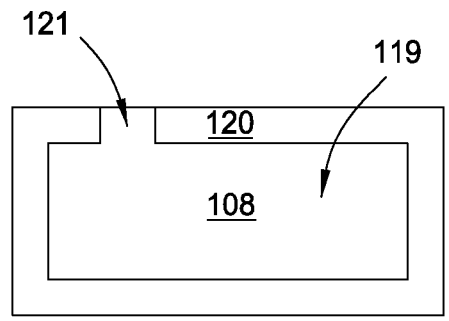
Figure 1O:
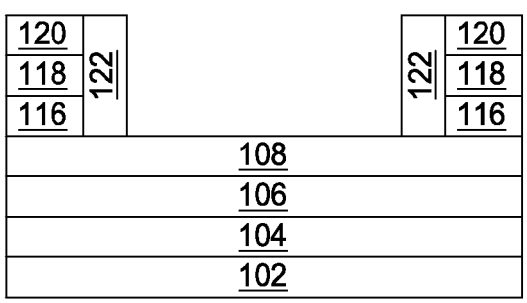
Figure 1P:
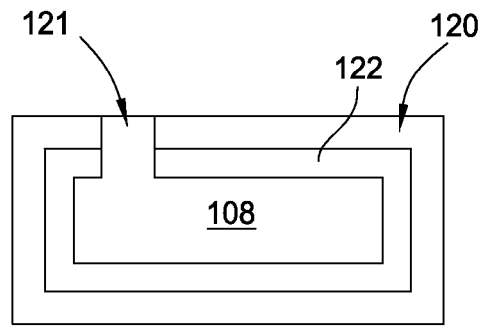
Figure 1Q:
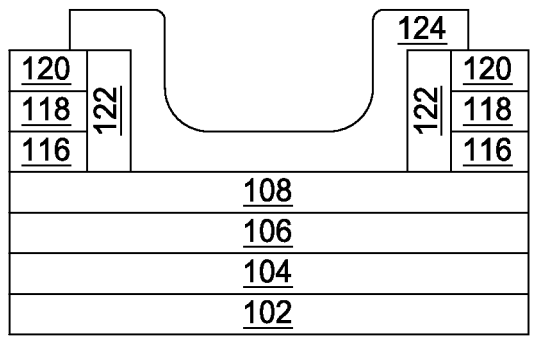
Figure 1R:
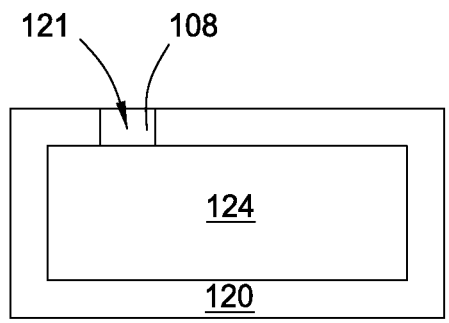
Figure 1S:
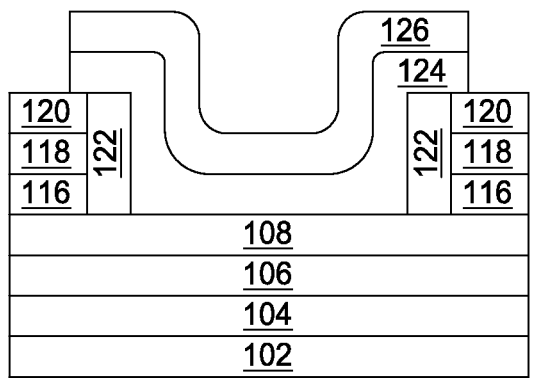
Figure 1T:
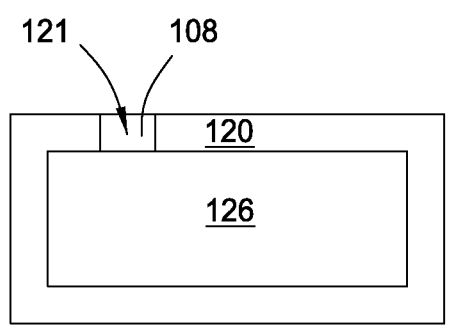
Figure 1U:
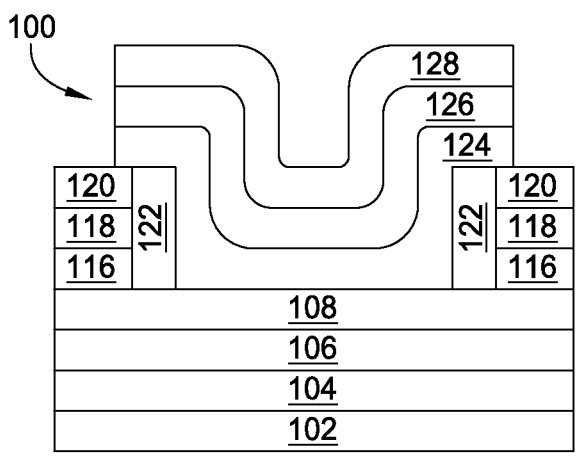
Figure 1V:
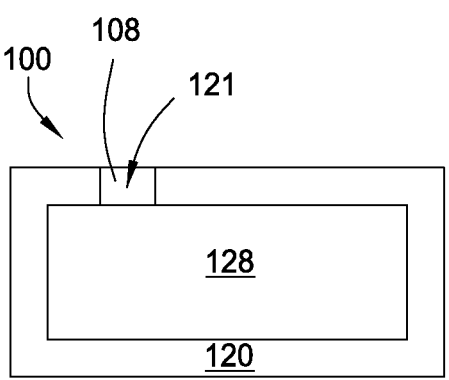

FIGS. 1A-1V are schematic cross-sectional and top views of a TFT 100 at various stages of production. FIGS. 1A, 1C, 1E, 1G, 1I, 1K, 1M, 1O, 1Q, 1S and 1U are cross-sectional views while FIGS. 1B, 1D, 1F, 1H, 1J, 1L, 1N, 1P, 1R, 1T and 1V are top views. As shown in FIGS. 1A and 1B, a gate electrode 104 is formed over a substrate 102. Suitable materials that may be utilized for the substrate 102 include, but may not be limited to, silicon, germanium, silicon-germanium, soda lime glass, glass, semiconductor, plastic, steel or stainless steel substrates. Suitable materials that may be utilized for the gate electrode 104 include, but may not be limited to, chromium, copper, aluminum, tantalum, titanium, molybdenum, and combinations thereof, or conductive transparent oxides (TCO) such as ITO (indium tin oxide) or ZnO:F commonly used as transparent electrodes. The gate electrode 104 may be deposited by suitable deposition techniques such as physical vapor deposition (PVD), MOCVD, spin-on process, and printing processes. If necessary, the gate electrode 104 may be patterned using an etching process.

Over the gate electrode 104, a gate dielectric layer 106 may be deposited as shown in FIGS. 1C and 1D. Suitable materials that may be used for the gate dielectric layer 106 include silicon dioxide, silicon oxynitride, silicon nitride, aluminum oxide or combinations thereof. The gate dielectric layer 106 may be deposited by suitable deposition techniques including plasma enhanced chemical vapor deposition (PECVD).

A channel semiconductor layer 108 is then formed over the gate dielectric layer 106 as shown in FIGS. 1E and 1F. The channel semiconductor layer 108 may comprise traditional semiconductor material used in TFTs such as amorphous silicon or polysilicon. Additionally, next generation semiconductor materials are also contemplated such as metal oxides including zinc oxide (ZnO) and indium-gallium-zinc oxide (IGZO) as well as oxynitrides such as indium-gallium-zinc-oxynitride (IGZON) and zinc oxynitride (ZnON). Other materials that are contemplated include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant such as Al, Sn, Ga, Ca, Si, Ti, Cu, Ge, In, Ni, Mn, Cr, V, Mg, $Si_xO_y$, $Si_xN_y$, $Al_xO_y$, and SiC. The channel semiconductor layer 108 may be deposited by a suitable deposition method such as PVD, PECVD, chemical vapor deposition (CVD), or atomic layer deposition (ALD), spin-on or printing processes. The channel semiconductor layer 108 permits the current to flow between the source and drain electrodes once the gate electrode 104 is biased. The channel semiconductor layer 108 may be patterned, if desired, by a wet etching process.

As shown in FIGS. 1G and 1H, over the channel semiconductor layer 108, a conductive layer 110 is deposited that will eventually form the first electrode which can be either the source or the drain electrode, depending upon the electrical connection. Hereinafter, it is to be understood that reference to the first electrode includes either the source electrode or the drain electrode. Suitable materials for the conductive layer 110 include chromium, copper, aluminum, tantalum, titanium, molybdenum, and combinations thereof, or TCOs mentioned above. The conductive layer 110 may be deposited by suitable deposition techniques, such as PVD. The conductive layer could be patterned through etching or a printing process as the first electrode, or not patterned, or partially patterned. The following gives the example that the first electrode is not patterned or partially patterned, (i.e., outside the first electrode is defined but the control portion of the first electrode is not defined or formed yet).

A first dielectric layer 112 is then deposited over the conductive layer 110 as shown in FIGS. 1I and 1J. Suitable materials that may be used for the first dielectric layer 112 include silicon dioxide, silicon oxynitride, silicon nitride, or combinations thereof. The first dielectric layer 112 may be deposited by suitable deposition techniques, including PECVD. A second dielectric layer 114 is then deposited over the first dielectric layer 112 as shown in FIGS. 1K and 1L. Suitable materials that may be used for the second dielectric layer 114 include silicon dioxide, silicon oxynitride, silicon nitride, or combinations thereof. The second dielectric layer 114 may be deposited by suitable deposition techniques, including PECVD. In one embodiment, the first dielectric layer 112 and the second dielectric layer 114 comprise separate, distinct layers that comprise different materials. In another embodiment, the first dielectric layer 112 and the second dielectric layer 114 may comprise a single layer.

The second dielectric layer 114, the first dielectric layer 112 and the conductive layer 110 are then patterned as shown in FIGS. 1M and 1N to create the first electrode 116, patterned first dielectric layer 118 and patterned second dielectric layer 120. As shown in FIG. 1N, a via 119 is present such that the first electrode 116, the patterned first dielectric layer 118 and the patterned second dielectric layer 120 bound the via 119. In the embodiment shown in FIG. 1N, the first electrode 116 has a slot 121 therein such that the first electrode 116 does not completely encircle the exposed channel semiconductor layer 108, but does at least partially encircle the exposed channel semiconductor layer 108. However, it is to be understood that the first electrode 116 could completely encircle the channel semiconductor layer 108 or with a large opening cross several sides. After the patterning, a portion of the channel semiconductor layer 108 is exposed. While the patterning is shown as occurring after the second dielectric layer 114, the first dielectric layer 112 and the conductive layer 110 have all been deposited, it is contemplated that the patterning may occur after the deposition of the second dielectric layer 114, the deposition of the first dielectric layer 112 and the deposition of conductive layer 110. Additionally, it is contemplated that the patterning may occur after the deposition of the conductive layer 110 and then again after the collective deposition of the first dielectric layer 112 and the second dielectric layer 114. The patterning may occur by forming a mask over the uppermost layer (i.e., the second dielectric layer 114 in FIGS. 1K and 1L) and then etching the exposed surfaces. Different etching conditions may be necessary for each layer etched.

A spacer layer is then deposited over the exposed surfaces and selectively removed so that a spacer 122 remains along the edges of the first electrode 116, the patterned first dielectric layer 118 and the patterned second dielectric layer 120. The spacer 122 is also present on the now exposed channel semiconductor layer 108. However, as shown in FIGS. 1O and 1P, the spacer 122 does not cover the entire channel semiconductor layer 108 as the spacer layer has been removed from selected portions of the channel semiconductor layer 108. Thus, a portion of the channel semiconductor layer 108 remains exposed after the formation of the spacer 122. Suitable materials that may be used for the spacer 122 include silicon dioxide, silicon oxynitride, silicon nitride, or combinations thereof. The spacer 122 may be deposited by suitable conformal deposition techniques including PECVD, CVD and ALD. After the conformal deposition process, a spacer etch or photo-resist patterning plus an etch process occurs to form the spacer 122. After the spacer formation, the second source dielectric layer may or may not exist. If the second dielectric layer is removed during the spacer etch, the thickness of the first source dielectric may or may not be reduced. The dielectric layers 118, 120 and spacer 122 can insulate the first and second electrodes 116, 128 from each other. The spacer layer 122 can be used for selective etching. For example, the spacer 122 can be formed by a conformal deposition process formed over the second dielectric layer 120 and the sidewalls that surround the channel semiconductor layer 108. The second dielectric layer 120 is harder to etch than the spacer 122, the spacer 122 can be over etched without any fear of losing dielectric material over the electrode 116 during the spacer etch process.

A first control semiconductor layer 124 is then formed over the exposed channel semiconductor layer 108, the spacer 122 and the patterned second dielectric layer 120. The first control semiconductor layer 124 is formed by blanket depositing a layer and then etching the layer to leave the resulting structure shown in FIGS. 1Q and 1R. The first control semiconductor layer 124 may comprise traditional semiconductor material used in TFTs such as amorphous silicon or polysilicon. Additionally, next generation semiconductor materials are also contemplated such as IGZO and ZnON. Other materials are contemplated such as boron doped or phosphorous doped, or no doped amorphous silicon and its combination with these or with others. Additionally materials that are contemplated include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant such as Al, Sn, Ga, Ca, Si, Ti, Cu, Ge, In, Ni, Mn, Cr, V, Mg, $Si_xN_y$, $Al_xO_y$, and SiC. The first control semiconductor layer 124 may be deposited by suitable deposition methods such as PVD, PECVD, CVD, or ALD. The first control semiconductor layer 124 is disposed over the source electrode 116, the patterned first source dielectric layer 118 and the patterned second source dielectric layer 120.

The purpose of a control semiconductor layer is to create an additional barrier for electrons to flow easily in one direction, yet difficult for electrons to flow in the opposite direction, such as a diode or rectifying effect. The control semiconductor layer lets electrons flow only under certain source-drain voltage differences. A controlling semiconductor layer has a different composition than the adjacent channel semiconductor layer. Without a controlling semiconductor layer, the barrier could still be created based upon the difference of work functions, surface charge trapping or even surface defects that are created by intentionally creating defects in the semiconductor layer.

Over the first control semiconductor layer 124, a second control semiconductor layer 126 is formed. The second control semiconductor layer 126 is formed by blanket depositing a layer and then etching the layer to leave the resulting structure shown in FIGS. 1S and 1T. The second control semiconductor layer 126 may comprise traditional semiconductor material used in TFTs such as amorphous silicon or polysilicon. Additionally, next generation semiconductor materials are also contemplated such as IGZO and ZnON. Other materials that are contemplated include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant such as Al, Sn, Ga, Ca, Si, Ti, Cu, Ge, In, Ni, Mn, Cr, V, Mg, $Si_xN_y$, $Al_xO_y$, and SiC. Other materials are contemplated such as boron doped or phosphorous doped, or no doped amorphous silicon and its combination with these or with others. The second control semiconductor layer 126 may be deposited by suitable deposition methods, such as PVD, PECVD, CVD, or ALD. The second control semiconductor layer 126 is disposed over the first control semiconductor layer 124, the source electrode 116, the patterned first source dielectric layer 118 and the patterned second source dielectric layer 120. Dielectric layer 120 could be removed partially or fully during formation of the dielectric spacer 122. The second control semiconductor layer 126 is used for tuning the barrier.

Finally, over the second control semiconductor layer 126, the second electrode 128 is formed as shown in FIGS. 1U and 1V. The second electrode 128 is formed by blanket depositing a conductive material and then etching the conductive material to form the final structure of the second electrode 128. Suitable materials for the second electrode 128 include chromium, copper, aluminum, tantalum, titanium, molybdenum, and combinations thereof, or TCOs mentioned above. The second electrode 128 may be deposited by suitable deposition techniques, such as PVD. As shown in FIGS. 1U and 1V, the first electrode 116, while disposed below the second electrode 128, in essence surrounds the second electrode 128 because the first electrode 116 forms at least a portion of the via 119 in which the second electrode 128 is deposited. However, it should be noted that a portion of the second electrode 128 is disposed over the first electrode 116, the patterned first dielectric layer 118, the patterned source dielectric layer 120, the first control semiconductor layer 124 and the second control semiconductor layer 126.

Electrode 128 covers the channel semiconductor layer 108 as shown in FIGS. 1U and 1V to protect the channel semiconductor layer 108 from light. If the channel semiconductor layer 108 is exposed to light, then the channel semiconductor layer 108 becomes conductive.

The channel semiconductor layer 108 and the control semiconductor layers 124, 126 may comprise different materials. For example, the channel semiconductor layer 108 may comprise a metal oxide or a metal oxynitride while the control semiconductor layers 124, 126 may comprise amorphous silicon. In one embodiment, the channel semiconductor layer 108 and the control semiconductor layers 124, 126 comprise the same material. For example, the control semiconductor layers 124, 126 and the channel semiconductor layer 108 may comprise a metal oxynitride. It is contemplated that a barrier layer (not shown) may be present between the channel semiconductor layer 108 and the first control semiconductor layer 124. Suitable materials for the barrier layer include silicon oxide or silicon nitride, or not doped or doped amorphous silicon. The controlling region of the on-off for the TFT 100 results from a barrier between the channel semiconductor layer 108 and the first control semiconductor layer 124, a barrier created inside the control semiconductor material or a barrier between the source electrode 116 and the first channel semiconductor layer 124, or a barrier between the drain electrode 128 and the second control semiconductor layer 126. The barrier created inside the control semiconductor material can result from the Fermi level difference, work function difference, band gap difference, or other film property differences.

Figure 2A:
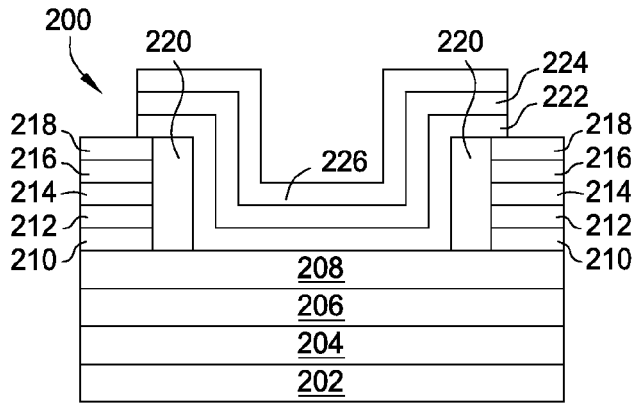
FIGS. 2A and 2B are schematic cross-sectional and top views of an offset TFT 200 according to another embodiment.
Figure 2B:
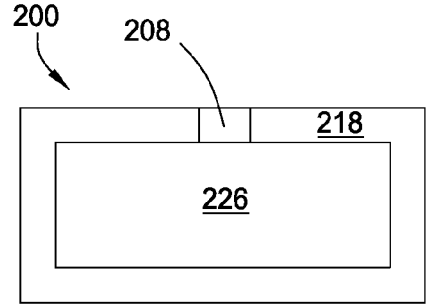

FIGS. 2A and 2B are schematic cross-sectional and top views of an offset TFT 200 according to another embodiment. The TFT 200 includes a substrate 202, gate electrode 204, gate dielectric layer 206 and channel semiconductor layer 208. However, there is both a first control semiconductor layer 210, 222 and a second control semiconductor layer 212, 224 that are present adjacent to each electrode 214, 226. Either electrode 214, 226 may function as the source electrode while the other electrode 214, 226 functions as the drain electrode. The first electrode 214 could completely encircle the channel semiconductor layer 108 or with a large opening cross several sides not shown. Both the first control semiconductor layer 210, 222 and the second control semiconductor layer 212, 224 are below each of the first and second electrodes 214, 226. Additionally, multiple dielectric layers 216, 218 and a spacer 220 are present. Dielectric layer 218 could be removed partially or fully during formation of the dielectric spacer 222. Thus, in the embodiment shown in FIGS. 2A and 2B, control semiconductor layers are present at both the first and second electrodes 214, 226 whereas in the embodiment shown in FIGS. 1A-1V, the control semiconductor layers are present at only one electrode. The control semiconductor layers 210, 212, 222, 224 are spaced apart by spacer 220.

Figure 3A:
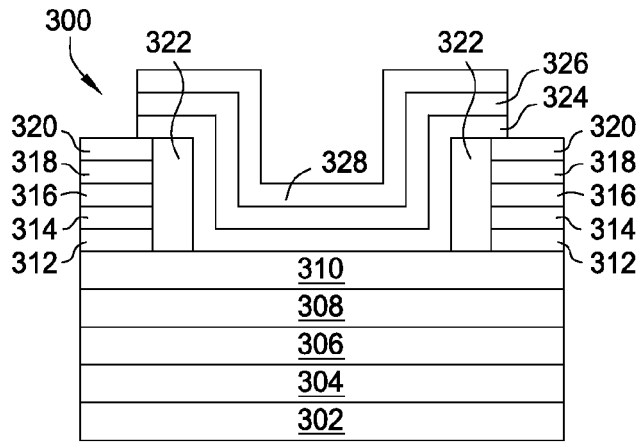
FIGS. 3A and 3B are schematic cross-sectional and top views of an offset TFT 300 according to another embodiment.
Figure 3B:
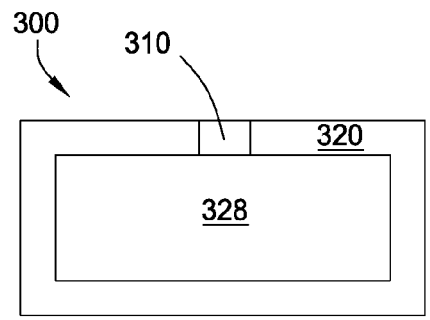

FIGS. 3A and 3B are schematic cross-sectional and top views of an offset TFT 300 according to another embodiment. The TFT 300 includes a substrate 302, gate electrode 304, gate dielectric layer 306 and channel semiconductor layer 308. Over the channel semiconductor layer 308, a first control semiconductor layer 310 is present. Additionally, there is both a second control semiconductor layer 312, 324 and a third control semiconductor layer 314, 326 that are present. Both the second control semiconductor layer 312, 324 and the third control semiconductor layer 314, 326 are below each of the first and second electrodes 316, 328. The first electrode 316 could completely encircle the channel semiconductor layer 108 or with a large opening cross several sides not shown. Additionally, multiple dielectric layers 318, 320 and a spacer 322 are present. Dielectric layer 320 could be removed partially or fully during formation of the dielectric spacer 322. Thus, in the embodiment shown in FIGS. 3A and 3B, control semiconductor layers are present at both the first and second electrodes 316, 328, just as in FIGS. 2A and 2B. Control semiconductor layers 312, 314, 324, 324 are spaced apart by spacer 322, but there is an additional control semiconductor layer 310 that spans across the entire channel semiconductor layer 308.

Figure 4A:
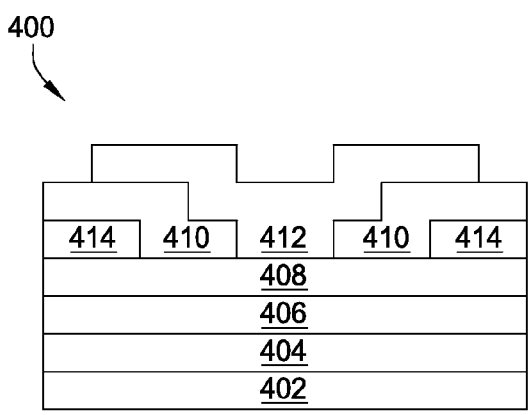
FIGS. 4A and 4B are schematic cross-sectional and top views of an offset TFT 400 according to another embodiment.
Figure 4B:
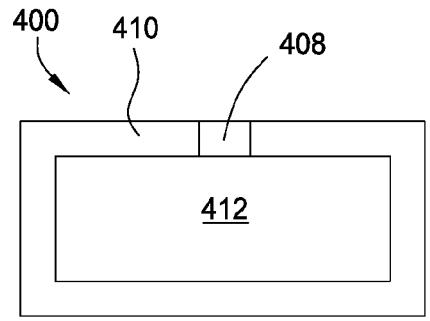

FIGS. 4A and 4B are schematic cross-sectional and top views of an offset TFT 400 according to another embodiment. In TFT 400, no control semiconductor layers are present. Rather, the TFT 400 includes a substrate 402, a gate electrode 404, a gate dielectric layer 406, a channel semiconductor layer 408 and first and second electrodes 412, 414 spaced apart by a spacer 410. The first electrode 414 could completely encircle the channel semiconductor layer 108 or with a large opening cross several sides not shown. Note that in each of FIGS. 2A, 2B, 3A, 3B, 4A and 4B, between 20 percent and 100 percent of the active channel (i.e., channel semiconductor layer between the first and second electrodes) is covered. A metal oxide TFT is more stable when the active channel is covered because the active channel is not exposed to light which can make the active channel conductive rather than semiconductive.

The offset electrode TFT structure can be used widely on many electronic applications such as OLED TV or other devices that require high current and stable threshold voltages. The TFTs disclosed herein have a higher current as compared to the state of the art TFTs because the actual channel length is much shorter when the device is turned on. The distance between the source and drain electrodes is reduced because of the location of the drain electrode relative to the source electrode. Additionally, the charge trapping at the interfaces in the channel region (the channel layer under the spacer) becomes not-critical for turning on the device since turning on the device will be determined by the accumulation in the control region which has channel semiconductor material, control semiconductor material and the drain electrode.

The TFTs described herein are beneficial for the next generation high definition displays. Due to one of the electrodes being over the top of the channel semiconductor layer, the TFT is smaller in size as compared to the traditional bottom gate TFT. Because the TFT is smaller in size, more pixels may be contained within a smaller space (i.e., higher density of pixels). Additionally, because the TFT is offset whereby an electrode covers the channel semiconductor layer, less energy is needed to illuminate the pixel. Finally, because one of the electrodes is formed over the channel semiconductor layer, metal oxides are not exposed to light which would otherwise render the metal oxides conductive rather than semiconductive. Therefore, the TFTs described herein are much more stable and reliable as compared to bottom gate and top gate TFTs.

While the foregoing is directed to embodiments of the present invention, other and further embodiments of the invention may be devised without departing from the basic scope thereof, and the scope thereof is determined by the claims that follow. Additionally, the term "over" as used herein is meant to include objects that are both above and in contact with another object as well as objects that are above and not in contact with the other object.

The invention claimed is:

1. A thin film transistor, comprising:
a gate electrode disposed above a substrate;
a gate dielectric layer disposed over the gate electrode;
a channel semiconductor layer disposed over the gate dielectric layer;
a first electrode disposed over the channel semiconductor layer and at least partially defining a via;
a second electrode disposed over the channel semiconductor layer, within the via and extending over at least a portion of the first electrode;
a first dielectric layer disposed over the first electrode;
a second dielectric layer disposed over the first dielectric layer, wherein the first electrode, the first dielectric layer and the second dielectric layer are shaped to have a via formed therethrough to expose the channel semiconductor layer, wherein the via is bordered by edges of the first electrode, the first dielectric layer, the second dielectric layer and the channel semiconductor layer;
a spacer layer disposed on the edges of the first electrode, the first dielectric layer, the second dielectric layer and the exposed channel semiconductor layer;
a first control semiconductor layer disposed over the channel semiconductor layer and the spacer layer; and
a second control semiconductor layer disposed over the first control semiconductor layer.

2. The thin film transistor of claim 1, wherein the channel semiconductor layer and the second control semiconductor layer comprise different materials.

3. The thin film transistor of claim 2, wherein the first control semiconductor layer and the second control semiconductor layer comprise different materials.

4. The thin film transistor of claim 3, wherein the first dielectric layer and the second dielectric layer comprise different materials.

* * * * *